United States Patent
Taniguchi et al.

(10) Patent No.: US 11,486,951 B2
(45) Date of Patent: Nov. 1, 2022

(54) MAGNETIC RESONANCE IMAGING APPARATUS AND MAGNETIC RESONANCE IMAGING METHOD

(71) Applicant: Hitachi, Ltd., Tokyo (JP)

(72) Inventors: Yo Taniguchi, Tokyo (JP); Hisaaki Ochi, Tokyo (JP); Tomoki Amemiya, Tokyo (JP); Toru Shirai, Tokyo (JP)

(73) Assignee: FUJIFILM HEALTHCARE CORPORATION, Chiba (JP)

( * ) Notice: Subject to any disclaimer, the term of this patent is extended or adjusted under 35 U.S.C. 154(b) by 0 days.

(21) Appl. No.: 17/203,944

(22) Filed: Mar. 17, 2021

(65) Prior Publication Data

US 2021/0373104 A1 Dec. 2, 2021

(30) Foreign Application Priority Data

May 29, 2020 (JP) .............................. JP2020-094154

(51) Int. Cl.
*G01V 3/00* (2006.01)
*G01R 33/54* (2006.01)
*G01R 33/48* (2006.01)
*G01R 33/56* (2006.01)

(52) U.S. Cl.
CPC ....... *G01R 33/543* (2013.01); *G01R 33/4818* (2013.01); *G01R 33/5608* (2013.01)

(58) Field of Classification Search
CPC .............. G01R 33/3415; G01R 33/543; G01R 33/5659; G01R 33/36; A61B 5/055
USPC ........................................................ 324/309
See application file for complete search history.

(56) References Cited

U.S. PATENT DOCUMENTS

| | | | | |
|---|---|---|---|---|
| 6,289,232 B1* | 9/2001 | Jakob | ................. | G01R 33/5611 324/307 |
| 2005/0131290 A1* | 6/2005 | Katscher | ............ | G01R 33/5611 600/410 |
| 2005/0258829 A1* | 11/2005 | Bieri | ................. | G01R 33/5613 324/307 |

(Continued)

FOREIGN PATENT DOCUMENTS

| CN | 104700440 A | * | 6/2015 |
|---|---|---|---|
| JP | 2004260768 A | * | 9/2004 |
| JP | 2011-024926 A | | 2/2011 |

*Primary Examiner* — Walter L Lindsay, Jr.
*Assistant Examiner* — Frederick Wenderoth
(74) *Attorney, Agent, or Firm* — Mattingly & Malur, PC

(57) ABSTRACT

In MRI, upon simultaneously generating computed images of multiple parameters, imaging time is efficiently reduced while preventing decrease in spatial resolution and SN ratio as much as possible. A plurality of original images is reconstructed from nuclear magnetic resonance signals acquired under various imaging conditions, and a computed image is obtained by calculation performed among the plurality of original images. The various imaging conditions include an imaging condition that a repetition time of an imaging sequence is different from one another, and upon imaging, the number of phase encoding steps is made smaller when the repetition time is long. An image is reconstructed in such a manner that a matrix size of the image obtained when the number of phase encoding steps is small is made equal to the matrix size of the image obtained when the number of phase encoding steps is large.

18 Claims, 14 Drawing Sheets

(56) References Cited

U.S. PATENT DOCUMENTS

| | | | |
|---|---|---|---|
| 2008/0187196 A1* | 8/2008 | Hu | G01R 33/4824 |
| | | | 382/128 |
| 2010/0066364 A1* | 3/2010 | Huwer | G01R 33/561 |
| | | | 324/309 |
| 2010/0290682 A1* | 11/2010 | Itagaki | G01R 33/5611 |
| | | | 382/131 |
| 2013/0099784 A1* | 4/2013 | Setsompop | G01R 33/4826 |
| | | | 324/309 |
| 2017/0248668 A1* | 8/2017 | Shen | G01R 33/5604 |

\* cited by examiner

FIG. 6

| P | FA (DEGREES) | θ (DEGREES) | TR (SECONDS) |
|---|---|---|---|
| 1 | 10. | 20. | 0.04 |
| 2 | 30. | 2. | 0.01 |
| 3 | 30. | 2. | 0.04 |
| 4 | 30. | 6. | 0.01 |
| 5 | 30. | 21. | 0.015 |
| 6 | 30. | 6. | 0.01 |

FIG. 9

| | TR [s] | (A) CONVENTIONAL [s] | (B) P1, P3 [s] | (C) ALL [s] |
|---|---|---|---|---|
| P1 | 0.04 | 10.24 | 7.68 | 7.68 |
| P2 | 0.01 | 2.56 | 2.56 | 1.92 |
| P3 | 0.04 | 10.24 | 7.68 | 7.68 |
| P4 | 0.01 | 2.56 | 2.56 | 1.92 |
| P5 | 0.015 | 3.84 | 3.84 | 2.88 |
| P6 | 0.01 | 2.56 | 2.56 | 1.92 |
| total | 0.125 | 32 | 26.88 (-16%) | 24 (-25%) |
| REDUCTION RATE PER IMAGING | - | - | -8% | -4.2% |

FIG. 14

|  | TR [s] | (A)<br>CONVENTIONAL [s] | (B)<br>P1, P3 [s] | (C)<br>ALL [s] |
|---|---|---|---|---|
| P1 | 0.04 | 192 | 144 | 144 |
| P2 | 0.01 | 48 | 48 | 36 |
| P3 | 0.04 | 192 | 144 | 144 |
| P4 | 0.01 | 48 | 48 | 36 |
| P5 | 0.015 | 72 | 72 | 54 |
| P6 | 0.01 | 48 | 48 | 36 |
| total | 0.125 | 600 | 504 (-16%) | 450 (-25%) |
| REDUCTION RATE PER IMAGING | - | - | -8% | -4.2% |

MAGNETIC RESONANCE IMAGING APPARATUS AND MAGNETIC RESONANCE IMAGING METHOD

INCORPORATION BY REFERENCE

The present application claims priority from Japanese patent application JP-2020-094154 filed on May 29, 2020, the content of which is hereby incorporated by reference into this application.

BACKGROUND OF THE INVENTION

Field of the Invention

The present invention relates to a magnetic resonance imaging technique. More particularly, the present invention relates to a method of estimating a subject parameter by calculation.

Description of the Related Art

In a magnetic resonance imaging (hereinafter referred to as MRI) apparatus, a nuclear spin contained in a tissue of a subject placed in a static magnetic field space is excited by an RF magnetic field pulse, thereby obtaining and imaging a nuclear magnetic resonance signal generated from the nuclear spin. A signal value of the thus obtained image is determined by conditions of the apparatus such as static magnetic field strength and a sensitivity of the reception coil, and physical characteristics of the nuclear spin contained in the tissue of the subject. In the imaging, an image emphasizing any of the physical properties described above is obtained, by varying imaging conditions including an echo time (TE) to generate the nuclear magnetic resonance signal, a repetition time (TR) for repeatedly acquiring the nuclear magnetic resonance signal, and set strength and phase of the RF magnetic field.

The physical characteristics of the subject include a longitudinal relaxation time T1, transverse relaxation time T2, spin density p, resonance frequency f0, diffusion coefficient D, an irradiation intensity B1 distribution of the RF magnetic field, and others, and they are referred to as subject parameters. The imaging conditions concerned with an image and conditions of the apparatus are referred to as imaging parameters and device parameters, respectively.

There is a method for obtaining from an MRI image by calculation, the parameters described above as quantitative values. In this method, multiple images (original images) are taken with different imaging parameters, and the subject parameters and the device parameters are calculated pixel by pixel basis. A resulting image having the subject parameters and the device parameters as pixel values are referred to as a computed image or a map.

To acquire the computed image, there is required a function (signal function) representing a relationship between the pixel values and the parameters; the imaging parameter, the subject parameter, and the device parameter. This signal function depends on an imaging sequence. In calculating the computed image (a subject parameter map or a device parameter map), a least squares fit is obtained for the signal function of the imaging parameters of multiple original images and their pixel values. So far, it has been difficult to acquire the computed images of multiple subject parameters and device parameters at the same time, because the signal function becomes complicated.

On the other hand, as one of the techniques to enable simultaneous acquisition of the computed images of multiple subject parameters and device parameters, there is a method of estimating a map by configuring the signal function by numerical simulation (JP-A-2011-024926, hereinafter referred to as Patent Document 1). This method enables acquisition of the computed image even in the pulse sequence where the signal function is not analytically obtained or it is too complex to be used for parameter estimation.

In estimating the computed image, the original images equal to or more than the number of parameters to be estimated are required. According to the method of Patent Document 1, six original images are taken in order to calculate four maps of T1, T2, ρ, and B1, for example. These original images are taken with varying three imaging parameters; flip angle (FA), phase (θ) of RF magnetic field pulse, and repetition time (TR), with the use of a gradient echo sequence.

Thus, in the method described in Patent Document 1, there is a problem that the entire imaging time becomes considerably long because it is necessary to take a lot of original images. The imaging time of the original image can be shortened by decreasing the number of phase encoding steps. However, reduction of the number of phase encoding steps for the original image causes lowering of spatial resolution and SN ratio (signal-to-noise ratio) of the computed image.

The present invention has been made in view of the above circumstances, to provide a technique for efficiently reducing the imaging time with preventing as much as possible such decrease in spatial resolution and SN ratio, when simultaneously generating the computed images of multiple parameters.

SUMMARY OF THE INVENTION

According to the present invention, in imaging a plurality of original images for acquiring a computed image, overall imaging time for acquiring the computed image can be reduced by controlling the number of phase encoding steps, in accordance with the length of TR (repetition time).

Specifically, the MRI apparatus of the present invention comprises, a measuring unit for applying an RF magnetic field and a gradient magnetic field to a subject placed in a static magnetic field, and measuring an echo signal generated from the subject, in accordance with an imaging sequence, an image reconstruction unit for obtaining a reconstructed image from the echo signal being measured, a controller for controlling the measuring unit and the image reconstruction unit, so that the measuring unit measures echo signals under a plurality of different (various) imaging conditions and the image reconstruction unit generates a plurality of reconstructed images using each of the echo signals measured under the various imaging conditions, and a computed image generator uses the plurality of reconstructed images and a signal function of the imaging sequence used by the measuring unit to generate the computed image. The various imaging conditions include the imaging condition where the repetition time of the imaging sequence is different from one another, and the controller controls the measuring unit in a such a manner that signal measurement is performed with setting the number of phase encoding steps in the imaging where the repetition time is long, to be smaller than the number of phase encoding steps in the imaging where the repetition time is short.

According to the present invention, by reducing the number of phase encoding steps only for the original image having a longer imaging time, the imaging time can be reduced more efficiently than reducing the number of phase encoding steps for the original image having a shorter imaging time. Further, it is possible to prevent reduction of spatial resolution or SN ratio, as compared with the case of reducing the number of phase encoding steps for all the original images.

BRIEF DESCRIPTION OF THE DRAWINGS

FIG. 6 illustrates an example of combinations of various imaging conditions;

FIG. 9 shows an effect of the first embodiment in numerical values;

FIG. 14 shows an effect of the third embodiment in numerical values.

DETAILED DESCRIPTION OF THE PREFERRED EMBODIMENTS

Figure 1:
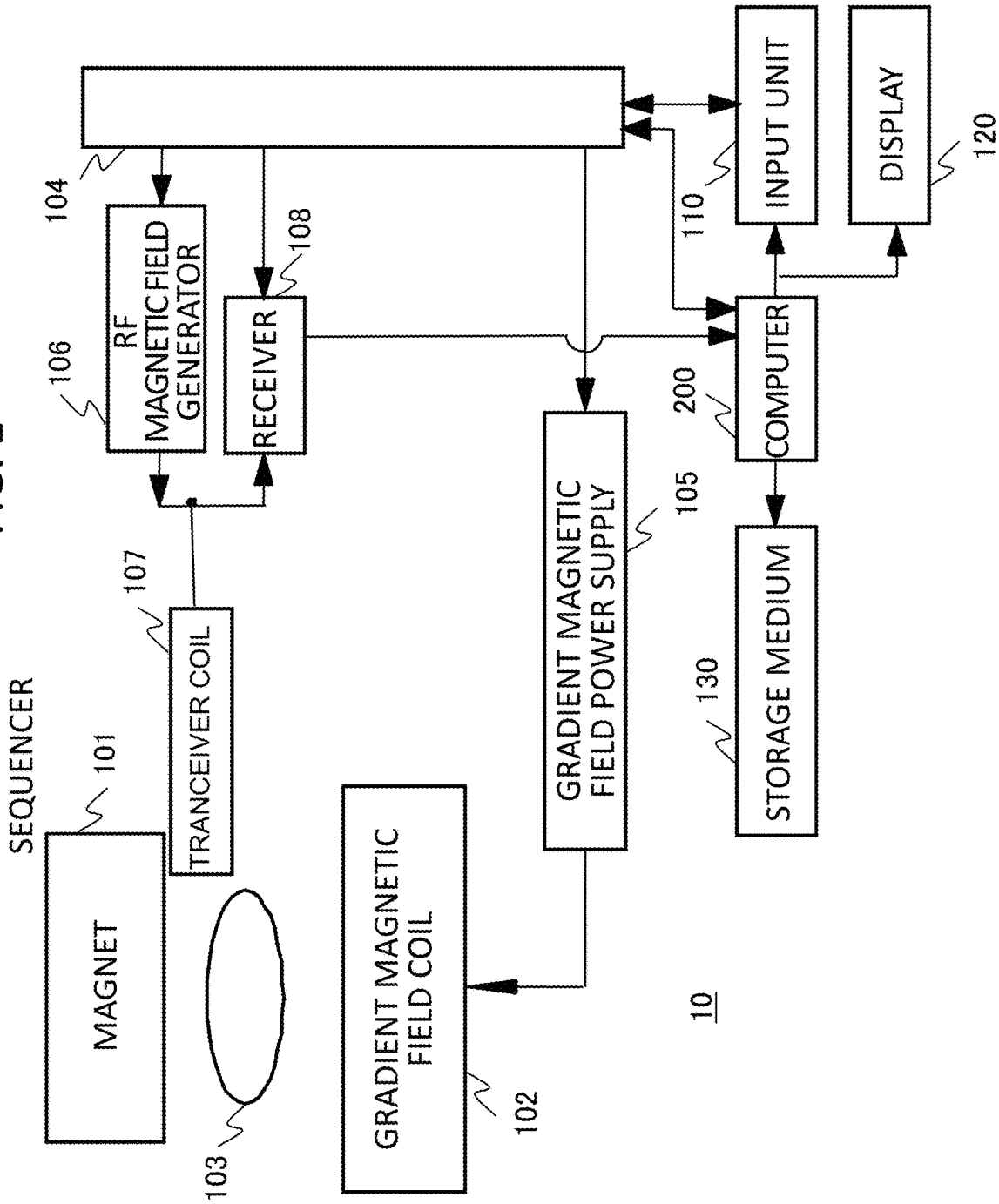
FIG. 1 is a block diagram showing an overall outline of an MRI apparatus to which the present invention is applied.

There will now be described a first embodiment to which the present invention is applied. Hereinafter, in all the figures for describing the embodiments of the present invention, those having the same functions are denoted by the same reference numerals, and a description thereof will not be provided redundantly.

First, an MRI apparatus of the present embodiment will be described. FIG. 1 is a block diagram showing a schematic configuration of the MRI apparatus 10 of the present embodiment. The MRI apparatus 10 includes a magnet 101 for generating a static magnetic field, a gradient magnetic field coil 102 for generating a gradient magnetic field, a sequencer 104, a gradient magnetic field power supply 105, an RF magnetic field generator 106, a transceiver coil 107 for applying an RF magnetic field and detecting a nuclear magnetic resonance signal (echo signal), and a receiver 108. The transceiver coil 107 is a single unit in the figure, but it may be provided with a transmission coil and a reception coil separately. Those elements above are collectively referred to as a measuring unit 100. A subject (e.g., a living body) 103 is placed on a table (not shown) in the static magnetic field space generated by the magnet 101.

The MRI apparatus 10 further includes a computer 200 for controlling the entire apparatus including the measuring unit 100 and performing an operation and others using an echo signal measured by the measuring unit 100, an input unit 110 for inputting a command and data necessary for the operation of the apparatus via the computer 200, a display (display unit) 120 for displaying an image as a calculation result of the computer 200 and a GUI and so on for a user input, a storage medium 130, and others.

The sequencer 104 sends a command to the gradient field power supply 105 and the RF magnetic field generator 106 to generate the gradient magnetic field and the RF magnetic field, respectively. The RF magnetic field is applied to the subject 103 through the transceiver coil 107. The nuclear magnetic resonance signal generated from the subject 103 is received by the transceiver coil 107, and the receiver 108 performs detection of the signal.

The sequencer 104 provides a nuclear magnetic resonance frequency (detection reference frequency f0) as a reference of the detection. The detected signal is sent to the computer 200 where signal processing, such as image reconstruction, is performed. The results are displayed on the display 120. If necessary, it is also possible to store the detected signal and measurement conditions in the storage medium 130.

The sequencer 104 calculates an imaging sequence, using a pulse sequence in which timing and intensity of the RF magnetic field, gradient magnetic field, and signal reception are determined as a program in advance, and imaging condition set for each imaging, and performs control so that each element of the measuring unit 100 operates according to the imaging sequence.

The computer 200 functions as a controller for sending a command to the sequencer 104 to operate the measuring unit 100, as well as functioning as an arithmetic unit for subjecting the echo signal acquired by the measuring unit 100 to various signal processing, to obtain a desired image.

Figure 2:
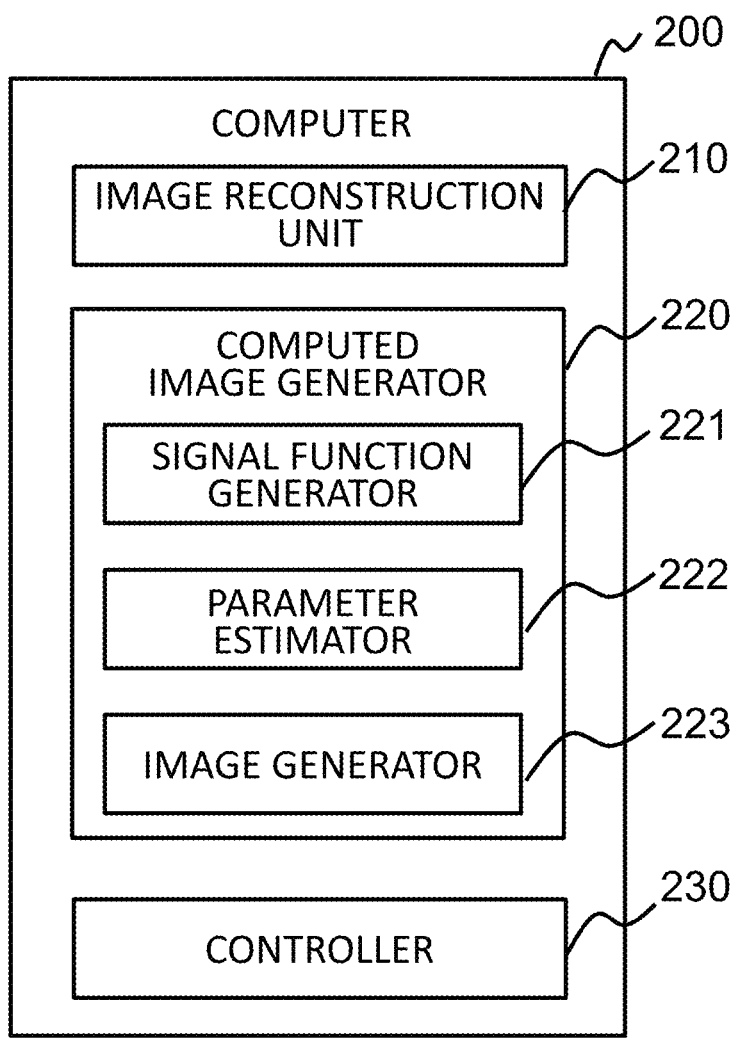
FIG. 2 is a functional block diagram of a main portion of the MRI apparatus according to the present invention.

As shown in FIG. 2, in order to implement those functions above, the computer 200 of the present embodiment comprises, an image reconstruction unit 210 for obtaining a reconstructed image from the measured echo signal, a computed image generator 220 for generating a computed image using the reconstructed image, and a controller 230 for controlling the entire apparatus including each element of the measuring unit 100, the image reconstruction unit 210, and the computed image generator 220. The computed image generator 220 comprises a signal function generator 221 that generates a signal function for each imaging sequence by numerical simulation, a parameter estimator 222 that estimates a quantitative value, by using the signal function for each imaging sequence and various types of reconstructed images (original images) generated by the image reconstructing unit 210, and an image generator 223. The quantitative value is at least one of the parameters depending on the subject and device-specific parameters. The parameter estimator 222 obtains one or more quantitative values pixel by pixel basis. The image generator 223 generates a desired image of the subject from a distribution (map) of the obtained quantitative values.

The computer 200 may comprise a CPU or a GPU and a memory, and the functions of the computer 200 described above are implemented when the CPU of the computer 200 loads a program stored in the storage medium 130 into the memory and executes the program. Further, the functions may be implemented by hardware such as PLDs (programmable logic device). It is to be noted the computed image generator 220 may be implemented in a computer provided independently of the MRI apparatus 10, being capable of transmitting and receiving data to and from the computer 200 of the MRI apparatus 10.

In the above-described configuration, the MRI apparatus of the present embodiment reconstructs a plurality of original images from the nuclear magnetic resonance signals acquired under various imaging conditions, and acquires a computed image, using the plurality of original images and the signal function of the imaging sequence used for imaging the original images. At this time, the various imaging conditions include the imaging condition in which the repetition time of the imaging sequence is different from one another, and the number of phase encoding steps is changed according to the length of the repetition time. In the image reconstruction of the original image, the reconstruction is performed in such a manner that a matrix size of the image obtained when the number of phase encoding steps is small is made equal to the matrix size of the image obtained when the number of phase encoding steps is large.

Hereinafter, embodiments of the imaging method for acquiring the computed image will be described.

First Embodiment

Figure 3:
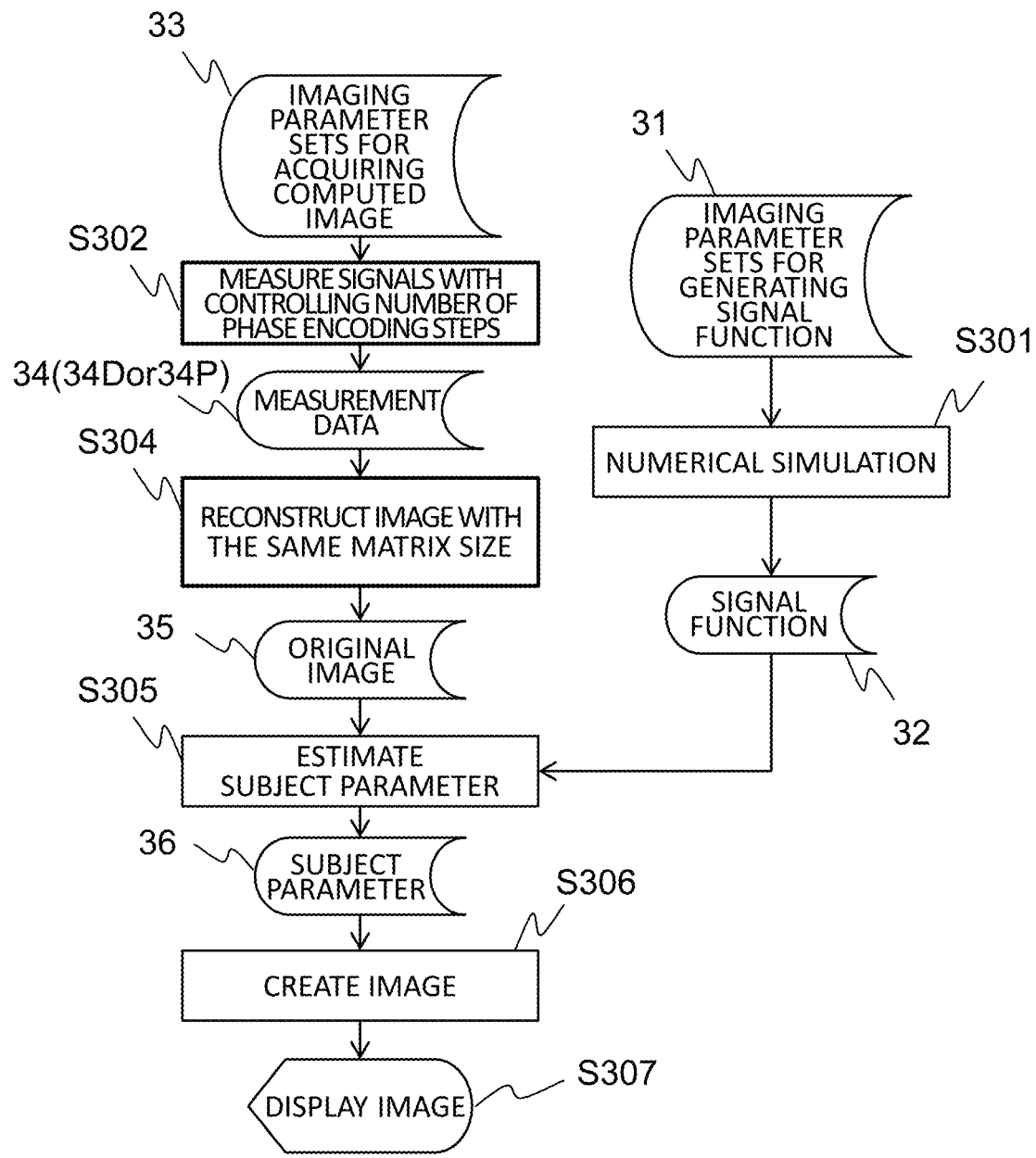
FIG. 3 is a flowchart illustrating an operation of a first embodiment.

In the present embodiment, the number of phase encoding steps in the imaging process where the repetition time is long, among the imaging processes to acquire a plurality of original images, is reduced to be less than the number of phase encoding steps in the imaging process with a short repetition time. As a method for decreasing the number of phase encoding steps, measurement of high frequency data in the k-space is performed less than the measurement of low frequency data, among the measured data arranged in the k-space, and an image is reconstructed by zero-filling in the unmeasured phase encoding portion of the k-space data. With reference to FIG. 3, there will now be described a procedure up to the generation of the computed image according to the present embodiment.

First, the signal function required for acquiring the computed image is obtained by numerical simulation (301). The signal function is determined for each imaging sequence. In the present embodiment, there will be described a case where the imaging sequence is 2D RF-spoiled GE sequence.

Figure 4A:
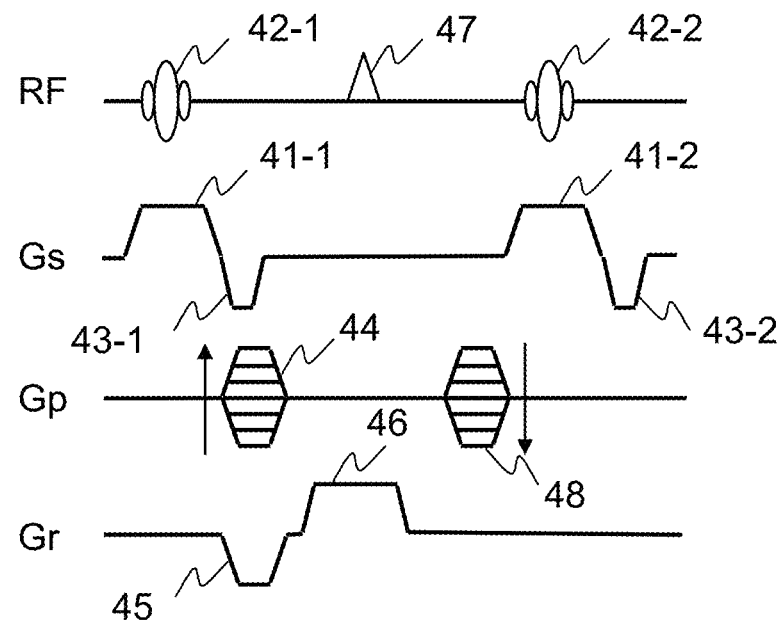
FIG. 4A illustrates an imaging sequence to be executed by a measuring unit.

FIG. 4A illustrates the RF-spoiled GE sequence. In the figure, RF, Gs, Gp, and Gr represent the RF magnetic field, slice gradient magnetic field, phase encoding gradient magnetic field, and read-out gradient magnetic field, respectively (the same shall apply hereinafter). In the RF-spoiled GE sequence, first, an RF magnetic field (RF) pulse 42 is applied with the application of a slice gradient magnetic field pulse 41 to excite magnetization of a certain slice in the object of interest. Then, after applying a slice phase gradient magnetic field pulse 43, a phase encoding gradient magnetic field pulse 44 for adding position information of the phase encoding direction, to the magnetization phase, and a read-out gradient magnetic field for dephasing 45, a magnetic resonance signal (echo) 47 is measured while applying the read-out gradient magnetic field pulse 46 for adding the position information of the read-out direction. Finally, a phase encoding gradient magnetic field pulse for dephasing 48 is applied.

This sequence is repeated every repetition time TR, while changing an increment value of the phase of the RF pulse 42 by 117 degrees (the phase of the nth RF pulse becomes θ(n)=θ(n−1)+117n) with changing the intensity (phase encoding amount kp) of the phase encoding gradient magnetic field pulses 44 and 48, and the number of echo signals required for reconstructing one image is measured. In the figure, "−1" and "−2" following the reference numerals represent the number of repetitions.

The pixel values of the image obtained according to this imaging sequence depends on the subject parameters, including the longitudinal relaxation time T1, the transverse relaxation time T2, the spin density ρ, and the RF irradiation intensity B1, and the pixel value varies with the imaging parameters. The imaging parameters being changeable in the RF-spoiled GE sequence are FA (flip angle), TR (repetition time), TE (echo time), and θ (RF phase increment value). Among these parameters, the RF phase increment value is conventionally fixed at 117 degrees to obtain image contrast having less T2 dependency, equivalent to that of FLASH (registered trademark), which is one of the high-speed imaging methods. When the RF phase increment value θ is changed, the T2 dependency of the image contrast changes drastically. Therefore, in the present embodiment, the RF phase increment value θ shall also be a changeable imaging parameter.

When the subject parameters and imaging parameters as described above are used as variables, the signal function fs of the RF-spoiled GE sequence is expressed as follows:

[Equation 1]

$$I=fs(\rho,T1,T2,B1,FA,TR,TE,\theta,Sc)=\rho Scf(T1,T2,B1\times FA, \theta,TR,TE) \quad (1)$$

where Sc is a reception coil sensitivity of the device parameter. Since B1 serves as a coefficient of FA during the imaging, it should be in the form of a product with FA. Since ρ and Sc act as proportional coefficients to the signal intensity, they are left outside the function. This allows fs to be rewritten in the equation of the right side using the signal function f.

In the numerical simulation (S301), signals are created by numerical simulation where the above-described imaging parameters FA, TR, and θ are comprehensively changed with respect to any value of T1 and T2 of the subject parameters, and a signal function is created by interpolation. The value of each parameter should include the range of the imaging parameters used for actual imaging and the range of T1 and T2 of the subject. Spin density ρ, B1, and Sc of the imaging object are assumed as constant (e.g., 1). Numerical examples of the imaging parameters and the subject parameters to be changed are shown below.

TR 4 pieces [ms]: 10, 20, 30, 40
FA 10 pieces [degrees]: 5, 10, 15, 20, 25, 30, 35, 40, 50, 60
θ 17 pieces [degrees]: 0, 1, 2, 3, 4, 5, 6, 7, 8, 9, 10, 12, 14, 16, 18, 20, 22
T2 17 pieces [s]: 0.01, 0.02, 0.03, 0.04, 0.05, 0.07, 0.1, 0.14, 0.19, 0.27, 0.38, 0.53, 0.74, 1.0, 1.4, 2.0, 2.8
T1 15 pieces [s]: 0.05, 0.07, 0.1, 0.14, 0.19, 0.27, 0.38, 0.53, 0.74, 1.0, 1.5, 2.0, 2.8, 4.0, 5.6

The signal function generator 221 constitutes imaging parameter sets 31 of all combinations of the above-described imaging parameters and subject parameters (173,400 combinations in the above example), and calculates the respective signal values.

In the numerical simulation S301, a subject model in which spins are arranged on grid points, imaging sequences, imaging parameters, and device parameters are inputted, and Bloch equations being basic equations of magnetic resonance phenomena are solved to output a magnetic resonance signal. The subject model is given as a spatial distribution of spins (γ, M0, T1, T2). Where γ is a gyromagnetic ratio and M0 is thermal equilibrium magnetization (spin density). By reconstructing an image from the magnetic resonance signals, it is possible to obtain an image under given conditions.

The Bloch equations are first-order linear ordinary differential equations, and they are expressed by the following equations:

[Equation 2]

$$\frac{d}{dt}\begin{pmatrix} M_x \\ M_y \\ M_z \end{pmatrix} = \begin{pmatrix} -\frac{1}{T2} & \gamma H & \\ -\gamma H & -\frac{1}{T2} & \gamma H1 \\ & -\gamma H1 & -\frac{1}{T1} \end{pmatrix} \begin{pmatrix} M_x \\ M_y \\ M_z \end{pmatrix} + \begin{pmatrix} 0 \\ 0 \\ \frac{M_0}{T1} \end{pmatrix} \quad (2)$$

$$H = B_0 + G_x x + G_y y + G_z z + 2\pi \Delta f 0/\gamma$$

Here, (x, y, z) represents a three-dimensional orthogonal coordinate system, z is equal to the orientation of the static magnetic field (intensity is B0). Further, (Mx, My, Mz) is the magnitude of the nuclear magnetization of the subscript directions, Gx, Gy, Gz are the gradient magnetic field strength in the subscript directions, respectively, H1 is the RF magnetic field strength (the same as B1), and Δf0 is a frequency of a rotational coordinate system.

The signal function generator 221 generates a signal function fs (32) by interpolation, from the signal values obtained by the computer simulation described above. For the interpolation, it is possible to use the first order to the third order linear interpolation or spline interpolation.

Figure 5:
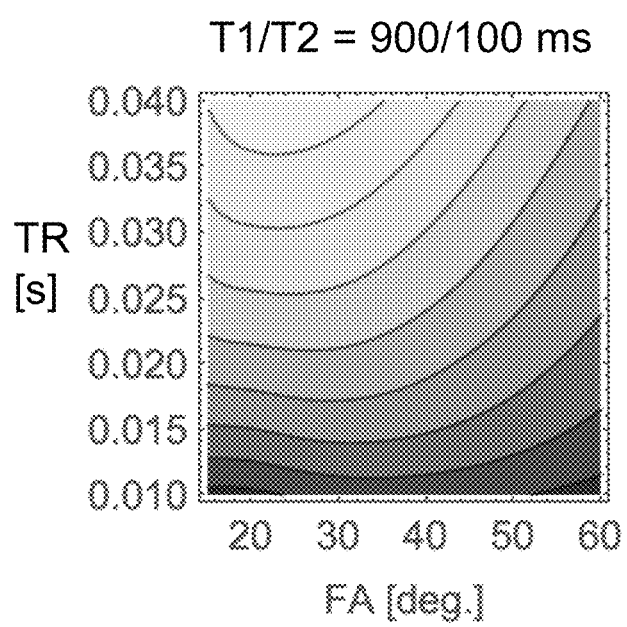
FIG. 5 illustrates an example of a signal function.

FIG. 5 shows a part of the intensity of the signal function created as described above. Here, it is displayed for the case of T1=900 ms, T2=100 ms, and θ=5 degrees, the horizontal axis represents FA, and the vertical axis represents TR. Once the signal function is created and stored, it is not necessarily created every time the computed image is taken, and it can be used repeatedly.

Meanwhile, the measuring unit 100 performs imaging of a plurality of original images using the imaging sequence (RF-spoiled GE sequence) with which the signal function has been calculated. Currently, the measuring unit 100 performs measurement of the echo signals in various imaging conditions (imaging parameters), and obtains the measurement data 34 for each imaging condition (S302). As the imaging parameters, there are used, for example, the repetition time (TR), the echo time (TE), the set strength of the RF magnetic field (flip angle (Flip Angle: FA)), the phase (θ) of the RF magnetic field and others, which are the same as the imaging parameters used for generating the signal function. A plurality of combinations (parameter sets) 33 of imaging conditions where a value of any one or more of these parameters is different from one another, is created in advance by a method such as an error propagation method, for example. The number of parameter sets shall be greater than the number of unknowns in calculating the quantitative values. The controller 230 provides thus created imaging parameter sets in the sequencer 104, and the measuring unit 100 performs imaging.

FIG. 6 illustrates an example of the parameter sets 33. In the illustrated example, since the number of parameters (T1, T2, B1, a) being unknowns, is four, the imaging parameter sets are combinations of six, larger than four, and each of the sets includes at least one imaging parameter value being different from one another among the combinations. In this example, the six sets of imaging parameters comprise combinations including FA of 10 degrees and 30 degrees, θ of 2 degrees, 6 degrees, 20 degrees, and 21 degrees, TR of 10 ms, 15 ms, and 40 ms (shown in seconds in FIG. 6). In the figure, the imaging number of each parameter set is shown in the column of P.

The measuring unit 100 performs imaging with each of the above-described imaging parameter sets, and collects the measurement data 34. Here, the matrix size of the measurement data (k-space) is determined by the number of phase encoding steps and the number of samplings, and usually a power of 2, such as 128×128, 256×256, and 514×514, is adopted for the image reconstruction using the Fourier transform. In the present embodiment, there is a control as the following; among the plurality of parameter sets, the number of phase encoding steps is set to a value smaller than the matrix size in the phase encoding direction of the image, for the imaging in which the repetition time TR is the longest, and for the other imaging, the number of phase encoding steps is rendered to be the same as the basic matrix size.

Figure 7:
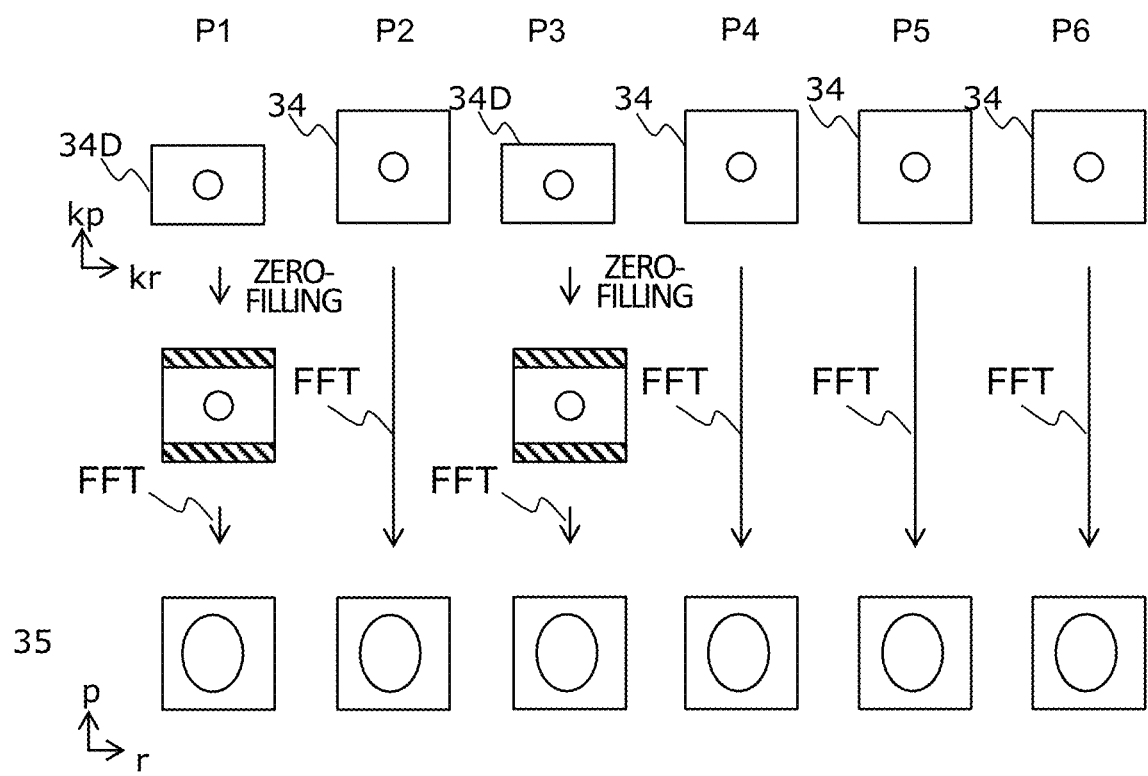
FIG. 7 illustrates an example of phase encoding control of the first embodiment.

As an example, there will be described the case where the matrix size of the original image is set to 256 in the read-out direction and 256 in the phase encoding direction. In the example shown in FIG. 6, since TR of P1 and P3 are both 40 ms (0.04 seconds) being the longest, the number of phase encoding steps of P1 and P3 is reduced to less than 256 that is lower the resolution of the original image. FIG. 7 illustrates how it works. In FIG. 7, the number of phase encoding steps is reduced by ¼ to 196. In order to reduce the resolution, echo measurement is not performed in the upper and lower ends of the phase encoding direction (kp direction) of the k-space (high-frequency portions diagonally shaded in the figure). The number of phase encoding steps remains 256 in the imaging of P2, and P4 to P6. By controlling the number of phase encoding steps as such in the imaging of P1 and P3, the measurement data 34D is obtained where the high-frequency portion of the k-space is missing.

Figure 8A:
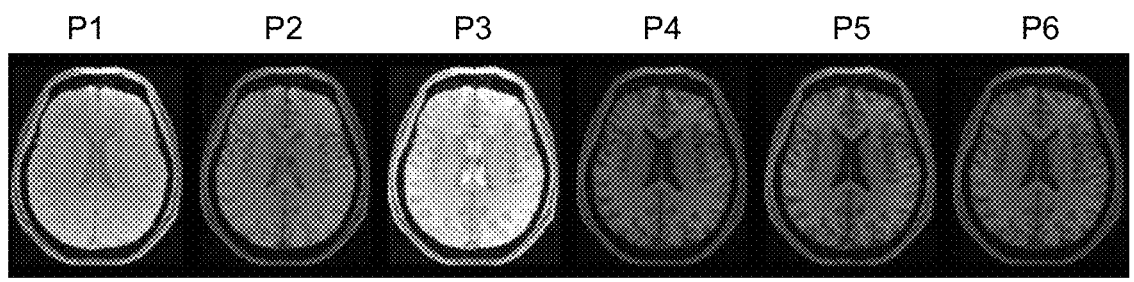
FIG. 8A shows original images acquired in the first embodiment.

Next, the image reconstruction unit 210 performs image reconstruction on the measurement data 34 and 34D (S303), and obtains the original images 35. At this time, in order to equalize the matrix size of all the original images, the size of the measurement data of P1 and P3 in the kp direction is made 256, by filling the high-frequency portions in the kp direction with zero. Then, according to the Fourier transform FFT, the original images from P1 to P6 are obtained. FIG. 8A shows the original images thus obtained. The original images of P1 and P3 are slightly lower in resolution, but images of the same matrix size can be obtained.

Next, using the above-described six original images 35 and the signal function 32, the parameter estimator 222 estimates the subject parameter and the device parameter (S304). Specifically, fitting of the signal value I for each pixel is performed with respect to the function f of Equation 3, obtained by modifying Equation 1, thereby estimating the subject parameters (T1, T2, B1) and a (a=ρSc) 36 being the product of ρ and the device parameter Sc.

[Equation 3]

$$I = af(T1, T2, \theta, B1 \times FA, TR)$$

$$a = \rho Sc \quad (3)$$

The function fitting can be performed, for example, by the least square's method represented by the following equation:

[Equation 4]

$$\chi^2 = \Sigma_{FA,\Delta\theta,TR}\{I(FA,\Delta\theta,TR) - af(T1,T2,\theta,B1 \times FA,TR)\} = \min \quad (4)$$

where χ is a sum of residuals (differences) of pixel values of the signal function and those of the phantom, and I is the pixel value with predetermined imaging parameters (FA, θ, TR).

The image generator 223 uses the pixel values of the parameters (T1, T2, B1, and a) thus obtained, and generates computed images respectively showing the distributions (S305). The computed image generator 220 displays the generated computed images on the display 120 (S306) and stores the images in the storage medium 130 as needed. The image generator 223 may generate, for example, one or more computed images as desired, specified by the user through the input unit 110, instead of creating the computed images of all four parameters.

Figure 8B:
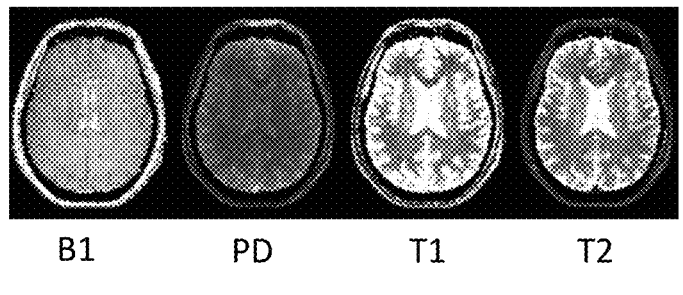
FIG. 8B shows computed images obtained from the original images.

FIG. 8B shows the computed images (B1 image, proton density image, T1 image, and T2 image) of the respective parameters generated from the six original images (FIG. 8A). As illustrated, minimal reduction of resolution is found in the computed images, because the resolution of only the two images, 1/3 of the six original images, has been reduced. In other words, when the resolution of all the original images is reduced to 3/4, the resolution of the computed image is also reduced to 3/4, but in this example, the resolution is reduced to 3/4 only in the original images corresponding to 1/3, so that the resolution of 11/12 (=(3/4+3/4+1+1+1+1)/6) is obtained, thereby considerably preventing reduction of resolution.

As for the shortening of the imaging time, in the present embodiment, the number of phase encoding steps is reduced only in the imaging with long TR, not simply reducing the number of phase encoding steps of all the imaging, thereby efficiently reducing the imaging time. FIG. 9 shows the effect of the imaging time reduction according to the present embodiment. FIG. 9 shows a result of an example in which the imaging P1 to the imaging P6 are performed using the six imaging-parameter sets shown in FIG. 6, comparing the method (B) of the present embodiment, with the case (A) in which the number of phase encoding steps is not reduced and the case (C) in which the number of phase encoding steps is reduced in all the images. The imaging time of each original image is equal to TR×number of phase encoding steps.

As shown, the total imaging time is 32 seconds when the number of phase encoding steps is not reduced (A). On the other hand, when the number of phase encoding steps of P1 and P3 is reduced to 3/4 (B), the total imaging time is 26.88 seconds, and when the number of phase encoding steps of all the original images from P1 to P6 is reduced to 3/4 (C), the total imaging time is 24 seconds, which is a reduction of 16% and 25%, respectively, when compared with (A). However, when the reduction rate of the imaging time per original image is compared with (B) and (C), in (B), the number of phase encoding steps of the two original images is reduced and the overall imaging time reduction is 16%, resulting in that the reduction rate per original image is 8%, whereas in (C), the reduction rate is 4.2% (25/6). Therefore, it is found that the time reduction efficiency of the present embodiment is superior. Moreover, in (C), the resolution also decreases uniformly because the number of phase encoding steps of all the original images is reduced. Therefore, in the present embodiment, by reducing the number of phase encoding steps only in the imaging with long TR, the imaging time can be shortened efficiently.

As described so far, according to the present embodiment, when acquiring different original images with a plurality of imaging conditions, the number of phase encoding steps is reduced in the imaging of the original image with long TR, thereby efficiently shortening the imaging time, with preventing the reduction of the resolution of the computed image as much as possible.

Modification of First Embodiment

In the first embodiment, control is performed to reduce the number of phase encoding steps in the imaging P1 and P3 being two imaging parameter sets with long TR, among the plurality of imaging parameter sets. When there is a plurality of imaging parameter sets with long TR, it is preferable to control the number of imaging where the number of phase encoding steps is to be reduced, to be approximately half the number of the original images at the maximum (the number of images used to generate the computed image). By controlling the number of original images with reduced number of phase encoding, to half of the total number of original images, it is possible to exert some control over reduction in the resolution and SN ratio of the resulting computed image.

In this situation, when more than half of the original images have the longest TR among the imaging parameter sets, it is preferable to determine the priority of the imaging parameter sets where the number of phase encoding steps is to be reduced in accordance with the SN ratio of the original image. Specifically, the SN ratio of the original image having a small SN ratio is maintained or made much larger. This is because, the SN ratio is sufficient when the SN ratio of the original image is large in general, and even if the SN ratio decreases to some extent, the effect on the computed image is small.

As for the relationship between the SN ratio and the number of phase encoding steps, in general, the smaller is the number of phase encoding steps to lower the resolution, the SN ratio becomes larger. For example, when the resolution is changed by increasing the number of phase encoding steps by a factor of r, the SN ratio becomes 1/r because the pixel size becomes 1/r. In addition, the SN ratio is √r times larger, because the sum effect proportional to the number of echo signal measurements, becomes r times larger. Therefore, when they are combined, the SN ratio becomes 1/√r. As in the first embodiment, when the resolution is reduced by decreasing the number of the phase encoding steps, the change of the SN ratio becomes 1/√r (>1) because r<1, indicating that when the number of phase encoding steps decreases, the SN ratio increases.

Therefore, when there are multiple images with the longest TR and the number of phase encoding steps is reduced by reducing the measurement in the high frequency portions (by reducing the resolution), it is better to preferentially reduce the number of phase encoding steps from the original image having a small SN ratio.

As for the SN ratio of the original image, generally, if the TR is the same, the SN ratio becomes smaller when the FA is small and the RF phase increment value is away from 0 degrees or 180 degrees. Therefore, in this case, the imaging parameter set with small FA and the RF phase increment value away from 0 degrees or 180 degrees is given a high priority. It is also possible to determine which imaging parameter set has a large SN ratio, by providing the signal function with the imaging parameter set and the T1 and T2 values of the subject, and then comparing the signal values.

As described above, the number of phase encoding steps is reduced considering not only the length of TR but also the SN ratio of the image obtained for each imaging parameter, thereby allowing acquisition of the computed image with favorable SN ratio.

Second Embodiment

In the first embodiment, in the imaging of the imaging parameter set including long TR, the resolution is decreased to reduce the phase encoding, but in the present embodiment, parallel imaging is adopted to reduce the phase encoding.

Also in this embodiment, the configuration of the computed image generator 220 is the same as that shown in FIG. 2, and the processing for generating the computed image is the same as that shown in FIG. 3. Hereinafter, with reference to FIG. 3 as appropriate, the processing of the present embodiment will be described focusing on the points different from the first embodiment. Also in the present embodiment, there will be described a case where the measuring unit 100 performs six imaging, using the six imaging-parameter sets P1 to P6 shown in FIG. 6, as an example.

The parallel imaging is an imaging method in which the number of phase encoding steps is reduced by equally thinning out (under-sampling) echoes in the kp direction, and the imaging time is shortened. In reconstructing an image, aliasing artifacts in the image caused by thinning out the echoes may be eliminated by parallel reconstruction utilizing the reception coil sensitivity.

In the present embodiment, when a plurality of imaging parameter sets is set, and when the parameter sets with long TR are specified (P1 and P3 in the example of FIG. 6), in imaging of those imaging parameter sets, the measuring unit 100 controls the phase encoding gradient magnetic field and performs measurement with k-space data uniformly thinned out. As for the other imaging parameter sets, the measurement is performed normally, i.e., with the number of phase encoding steps that matches the matrix size of the original image.

Figure 10:
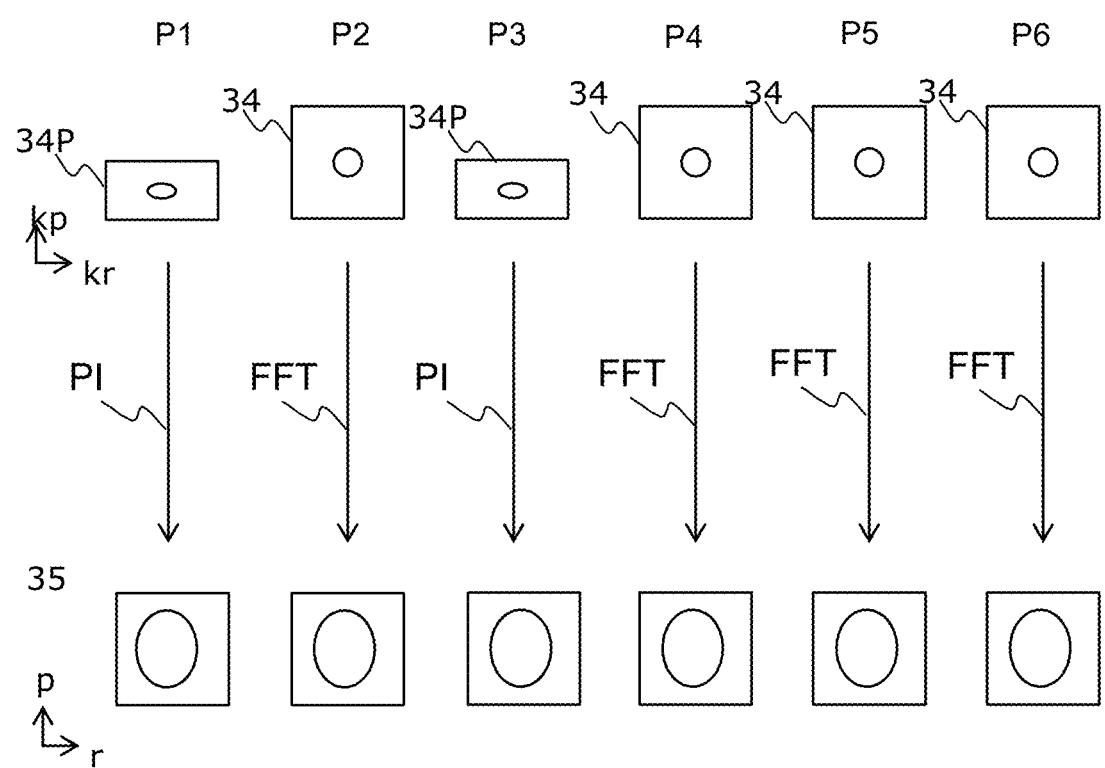
FIG. 10 illustrates an example of the phase encoding control of a second embodiment.

The rate at which the number of phase encoding steps is reduced, is determined by a reduction factor (R-factor) of the parallel imaging. FIG. 10 shows the measurement data when the R-factor is set to 2. As shown, since the R-factor of the parallel imaging of P1 and P3 having long TR is doubled, the measurement data 34P thereof becomes half in size in the kp direction.

Then, the image reconstruction unit 210 reconstructs the measurement data obtained by the six imaging processes, respectively, and acquires the original images. In this situation, for the measurement data obtained by thinning out the phase encoding (34P in FIG. 10), the parallel reconstruction (PI) such as SENSE method, SMASH method, and an improved method of SMASH, is performed with the use of a sensitivity profile of the reception coil, whereby an image without aliasing artifacts and having the same matrix size as the image obtained by other imaging can be obtained. The sensitivity profile of the reception coil may be obtained in advance by preliminary measurement using a phantom, or the like, and it may be obtained from the measurement data. In the latter case, some regions, including the center of the k-space, may be measured without thinning out the phase encoding. Fourier transform FFT is performed on the measurement data 34 other than the data above.

Using the six original images 35 thus obtained, in the same manner as in the first embodiment, the subject parameters 36 is estimated (S304), and the computed image is generated (S305).

The image obtained by the parallel imaging has almost the same resolution as the normal image obtained by the imaging other than the parallel imaging. However, since the number of echo measurements decreases, the SN ratio is lowered in inverse proportion to the square root of the R-factor. For example, if the R-factor is 2, the SN ratio is $1/\sqrt{2}$. Since the SN ratio of the two original images among the six original images is $1/\sqrt{2}$, the SN ratio of the computed images is also slightly reduced when compared with the case where the parallel imaging is not performed. However, similar to the effects of the resolution reduction and the imaging time shortening in the first embodiment, compared with the case where the R factors of all the original images from P1 to P6 are set to 2, the efficiency in shortening the imaging time is improved with respect to the decrease in the SN ratio.

Therefore, according to the present embodiment, by reducing the number of phase encoding steps of the original image having long TR and increasing the R-factor, it is possible to efficiently shorten the imaging time while preventing decrease in the SN ratio of the computed image as much as possible.

Modification of Second Embodiment

Also in the present embodiment, there are cases that more than one imaging parameter set with TR longer than the other is included in a plurality of imaging parameter sets. In this case, like the first embodiment, it is preferable that the number of imaging where the number of phase encoding steps is reduced be up to half the number of original images. This allows prevention of excessive decrease in the SN ratio in the computed image.

In addition, when there are more than one imaging parameter sets with the longest TR, also in the present embodiment, the priority of the imaging parameter sets as to which the number of phase encoding steps is reduced, is determined according to the SN ratio of the original image (such that the SN of the image with small SN ratio is maintained or increased). However, in the first embodiment, since the resolution is decreased to reduce the number of phase encoding steps, the original image in which the SN ratio is improved by lowering the resolution, that is, the number of phase encoding steps is preferentially reduced from the original image in which the SN ratio is small. However, in the parallel imaging, the SN ratio of the image decreases in proportion to the square root of the R-factor. Therefore, in the present embodiment where the number of phase encoding steps is reduced by the parallel imaging, it is desirable to preferentially select from the imaging parameter set that makes the original image have the larger SN ratio. Specifically, priority is given to the imaging parameter set having large FA and the RF phase increment value close to 0 degrees or 180 degrees.

When there are multiple candidates of imaging parameters that allow reduction of the number of phase encoding steps as described above, the priority is determined, considering not only the length of TR but also the SN ratio of the image obtained for each imaging parameter, whereby the computed image with a favorable SN ratio can be obtained. In particular, the priority of the imaging where the number of phase encoding steps is reduced, is determined according to the way how to reduce the number of phase encoding steps, thereby preventing deterioration of the S/N ratio.

Example of Display

Figure 11:
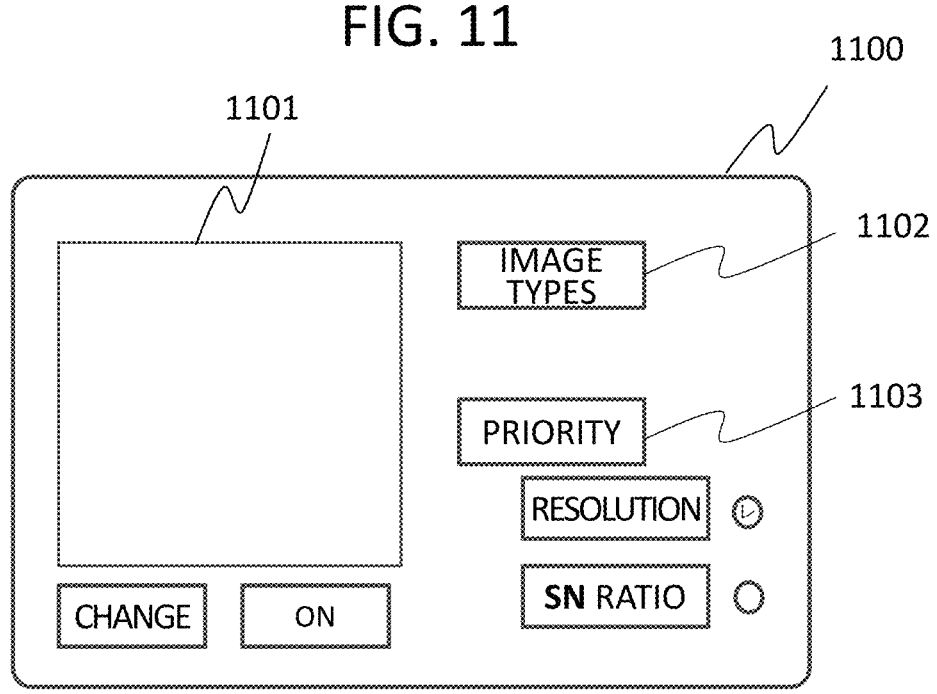
FIG. 11 illustrates an example of a GUI displayed during the imaging to obtain the computed image.

There have been described so far, two embodiments different in methods how to reduce the number of phase encoding steps and the modification thereof, and a user is allowed to select which method is to be executed, or to select any condition and others thereof. FIG. 11 illustrates an example of the display 120 that enables user selection.

In this display example, for example, when imaging for the computed image is set, a GUI 1100 for selecting a type of the computed image or selecting a priority of the image quality is displayed on the display 120. On the screen 1101 on the left, for example, the imaging parameter set is displayed, allowing changes thereof as required by the user may be accepted. On the screen on the right, a pull-down menu type button 1102 is displayed for selecting the computed image demanded by the user, and a button 1103 is displayed for selecting an image quality (resolution and SN ratio) to be prioritized according to the desired computed image. The user selects the "resolution" via the button 1103 and operates the imaging start button "ON", the measuring unit 100 performs measurement in the manner of the second embodiment, when. When the "SN ratio" is selected, the measurement is performed according to the method of the first embodiment.

Though not shown in FIG. 11, it is also possible to confirm the imaging parameter set displayed in the screen 1101 to accept the user selection of the parameter set for reducing the number of phase encoding steps. Further, on the screen 1101, images with different image qualities created by simulation may be displayed for the user's reference, or the original image or the generated computed image may be displayed. Furthermore, various changes and additions may be made such as displaying a screen for selecting 2D imaging or 3D imaging.

Third Embodiment

In the first and the second embodiments, a two-dimensional computed image is acquired. In the present embodiment, a three-dimensional computed image is acquired. Also in the present embodiment, the configuration of the computed image generator 220 and the procedure for generating the computed image are the same as those of the first and second embodiments. The present embodiment is different in the points that the measuring unit 100 uses a three-dimensional pulse sequence including phase encoding in two directions, and the control for reducing the number of phase encoding steps is performed in each of the two directions to which the phase encoding is assigned.

Figure 4B:
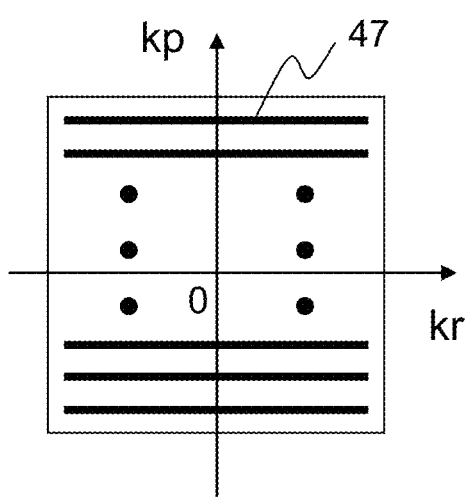
FIG. 4B illustrates k-space data to be acquired by the imaging sequence of FIG. 4A.
Figure 12:
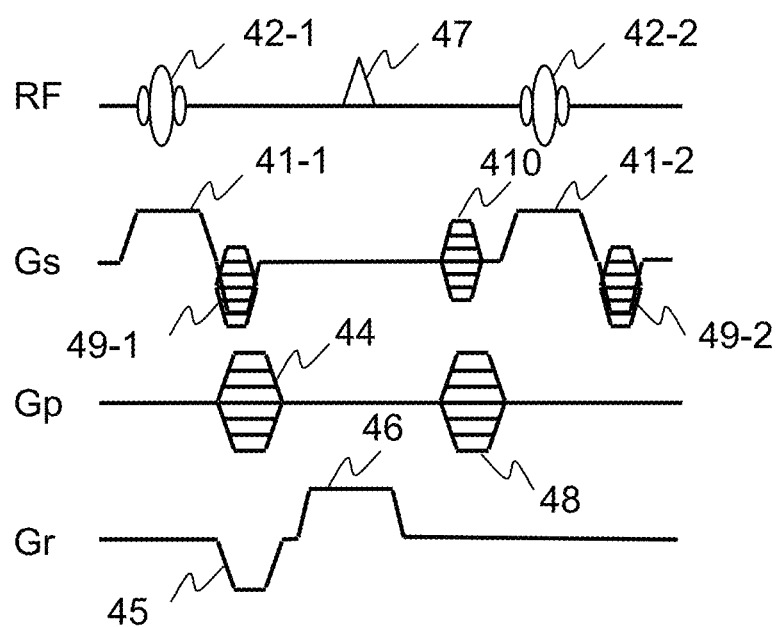
FIG. 12 illustrates an example of the imaging sequence used in a third embodiment.

FIG. 12 illustrates an example of the three-dimensional pulse sequence executed by the measuring unit 100 of the present embodiment. This pulse sequence is the RF-spoiled GE sequence, like the pulse sequence shown in FIG. 4, but a phase encoding pulse is added in the slice direction as well. That is, first, the RF magnetic field (RF) pulse 42 is applied with application of the slice gradient magnetic field pulse 41, to excite the magnetization of a slice in the object. Then, after applying the phase encoding pulse 49 of the slice direction which is also served as the slice rephase, the phase encoding gradient magnetic field pulse 44, and the read-out gradient magnetic field pulse 45 for dephasing, the magnetic resonance signal (echo) 47 is measured while applying the readout gradient magnetic field pulse 46 for adding the position information of the read-out direction. Finally, the dephasing pulses 410 and 48 are applied.

The above procedure is repeated with a repetition time TR while varying the intensity (phase encoding amounts ks and kp) of the phase encoding gradient magnetic field pulses 49 and 44, so as to measure the echoes required to obtain an image. Each echo is placed in the three-dimensional k-space (kr-kp-ks space), and the image is reconstructed by a three-dimensional inverse Fourier transform.

There will now be described a procedure for acquiring the computed image according to the present embodiment. Also in the present embodiment, the procedures for acquiring the computed image are the same as the processing shown in FIG. 3. Therefore, with reference to FIG. 3, descriptions will be provided focusing on different points.

First, the signal function 32 of the three-dimensional pulse sequence used for imaging is calculated by numerical simulation (S301).

Next, the measurement data 34 for a plurality of original images is measured, using a plurality of imaging parameter sets 33 which includes different combinations of the parameter values of the imaging parameters FA, TR, and θ (S302). Also in the present embodiment, as an example, the imaging parameter sets 33 are assumed as the six combinations of imaging parameter sets as shown in FIG. 6.

In measuring the measurement data 34, the number of phase encoding steps in the kp and ks directions is reduced in the imaging P1 and P3 with the imaging parameter set having long TR, to be smaller than the number of phase encoding steps in the imaging of the other parameter sets, whereby the resolution of the original image is reduced. In other words, in the imaging for reducing the phase encoding, the measurement of the data in the high-frequency range is not carried out in the kp direction and the ks direction of the k space, by the amount corresponding to the decreased amount of the phase encoding. A proportion of the imaging where the number of phase encoding steps is reduced shall be up to half the original matrix size.

Figure 13:
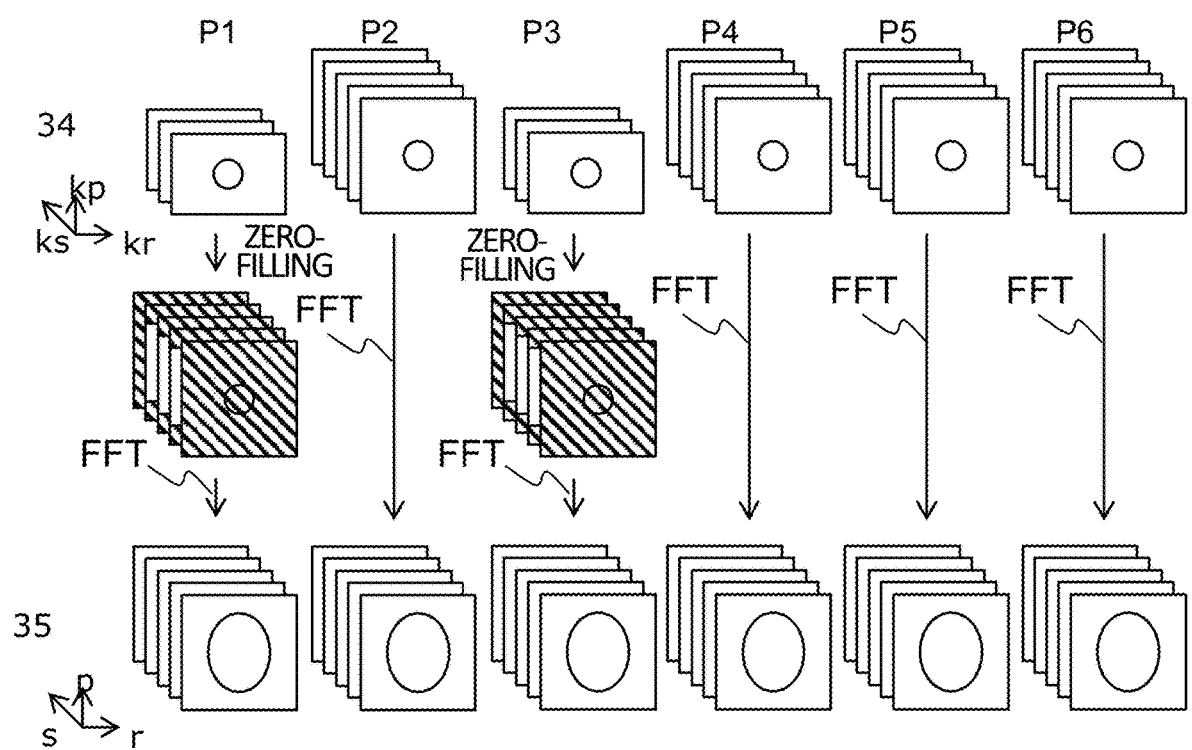
FIG. 13 illustrates an example of the phase encoding control of the third embodiment.

For example, when the matrix size of the original image is set to 256 in the read-out direction, 120 in the phase encoding direction, and in the slice direction, in the imaging P2, P4 to P6 of the imaging parameter sets not including long TR, the number of phase encoding steps in the kp direction and the ks direction is set to 120 and 40, respectively, in accordance with the matrix size of the image. In the imaging P1 and P3 with long TR, the number of phase encoding steps in the kp and ks directions is reduced by ¼, to 90 and 30 respectively. FIG. 13 illustrates this situation.

Next, the image reconstruction is performed on the measurement data 34 (S303), and the original image 35 is obtained. In this situation, as shown by diagonal lines in FIG. 13, in order to equalize the matrix size of the original image, the high-frequency portions of the measurement data 34P of P1 and P3, in the kp and ks directions are filled with zero to make the respective sizes to 120 and 40, and then, the original images from P1 to P6 are obtained by the Fourier transform FFT.

Using the original images 35 from P1 to P6 thus obtained and the signal function 32 of the imaging sequence created in step S301, the subject parameters and others (T1, T2, B1, a (=ρSc)) are estimated for each pixel in the same manner as in the first embodiment (S304), and the computed images are estimated (S305). The original images of P1 and P3 among the original images used for the estimation are slightly reduced in resolution because the high-frequency data is not measured, but the resolution of the computed image does not become lower relative to the case where the number of phase encoding steps of all the original images is reduced. This is the same as the first embodiment. On the other hand, as shown in FIG. 14, when the imaging time is compared, the imaging time reduction rate per original image is approximately doubled. That is, it is possible to effectively reduce the imaging time with preventing reduction in resolution.

Also in the present embodiment, when there is a plurality of parameter sets having the longest TR in the imaging parameter sets, the priority is determined in consideration of the SN ratio of the image, and control for reducing the number of phase encoding steps is performed on one or more imaging parameter sets having the high priority. In addition, it is preferable that the number of images with the reduced number of phase encoding steps is made to be up to half of the total number of original images used to obtain the computed image.

Modification of Third Embodiment

In the third embodiment, in performing the three-dimensional imaging, the number of phase encoding steps of the imaging having long TR is controlled to be reduced, in the phase encoding in each of the two directions. However, the number of phase encoding steps may be reduced only in one direction, for example, only in the direction (kp direction) in which the number of phase encoding steps is larger. In addition, to what degree is reduced the number of phase encoding steps may be different in two directions. For example, the proportion of decreasing in the direction where the number of phase encoding steps is large may be made greater than the proportion of decreasing in the direction where the number of phase encoding steps is small.

Furthermore, in the third embodiment, the number of phase encoding steps is reduced without measuring the high-frequency data of the k-space, but it is also possible to reduce the number of phase encoding steps by using three-dimensional parallel imaging in which the measurement data is uniformly thinned out. In this case, the image reconstruction unit 210 performs parallel reconstruction on the data obtained by the parallel imaging, and an image of the same matrix size can be obtained as the image of the other imaging.

There have been described so far, embodiments of the MRI apparatus and method of the present invention. Types and numerical values of the parameters described in the embodiments are merely examples, and the present invention is not limited thereto. The computed image may be any image obtained from a plurality of original images that are measured with different imaging conditions, and the computed image may include a secondary computed image that can be obtained by further performing calculation on the computed image.

What is claimed is:

1. A magnetic resonance imaging apparatus comprising, a measuring unit configured to apply an RF magnetic field and a gradient magnetic field to a subject placed in a static magnetic field, and to measure an echo signal generated from the subject, in accordance with an imaging sequence; and a computer coupled to the measuring unit, the computer configured to:

execute an image reconstruction unit that obtains a reconstructed image from the echo signal being measured, control the measuring unit and the image reconstruction unit, so that the measuring unit measures echo signals under various imaging conditions, and the image reconstruction unit generates a plurality of reconstructed images using each of the echo signals measured under the various imaging conditions, and execute a parameter estimator configured to use the plurality of reconstructed images and a signal function of the imaging sequence used by the measuring unit to estimate distribution of quantitative values of the subject, wherein the various imaging conditions include the imaging condition where a repetition time of the imaging sequence is different from one another, and wherein the computer is configured to control the measuring unit so that the number of phase encoding steps in imaging where the repetition time is long is smaller than the number of phase encoding steps in imaging where the repetition time is short.

2. A magnetic resonance imaging method, comprising applying, by a measuring unit, an RF magnetic field and a gradient magnetic field to a subject placed in a static magnetic field;

measuring, by the measuring unit, an echo signal generated from the subject in accordance with an imaging sequence and under various imaging conditions;

generating, by a computer, a plurality of reconstructed images using each of the echo signals measured under the various imaging conditions; and executing, by a computer, a parameter estimator configured to use the plurality of reconstructed images and a signal function of the imaging sequence to estimate distribution of quantitative values of the subject, wherein the various imaging conditions include an imaging condition where a repetition time of an imaging sequence is different from one another in the various imaging conditions, and wherein the method further comprises the step of controlling the measuring unit, by the computer, so that the number of phase encoding steps in imaging where the repetition time is long is smaller than the number of phase encoding steps in imaging where the repetition time is short.

3. The magnetic resonance imaging apparatus according to claim 1, wherein, the image reconstruction unit performs reconstruction so that a matrix size of the image obtained when the number of phase encoding steps is small is made equal to the matrix size of the image obtained when the number of phase encoding steps is large.

4. The magnetic resonance imaging apparatus according to claim 1, wherein the computer is configured to conduct less measurement of high-frequency data than measurement of low-frequency data, among k-space data determined by phase encoding, thereby reducing the number of phase encoding steps in the imaging where the repetition time is long.

5. The magnetic resonance imaging apparatus according to claim 4, wherein the image reconstruction unit performs reconstruction by zero-filling an unmeasured phase encoding portion in the k-space data obtained by the imaging where the number of phase encoding steps is small.

6. The magnetic resonance imaging apparatus according to claim 4, wherein, the computer is configured to give a high priority on the imaging for obtaining the image with a smaller signal-to-noise ratio to reduce the number of phase encoding steps, when the various imaging conditions include more than one imaging condition where the repetition time is equally long.

7. The magnetic resonance imaging apparatus according to claim 1, wherein, the computer is configured to reduce the number of phase encoding steps in the imaging where the repetition time is long, by thinning out k-space data determined by phase encoding.

8. The magnetic resonance imaging apparatus according to claim 7, wherein, the image reconstruction unit performs a parallel imaging operation on the k-space data acquired by thinning out the phase encoding, and reconstructs the image.

9. The magnetic resonance imaging apparatus according to claim 6, wherein,
the computer is configured to give a high priority on the imaging for obtaining the image with a higher signal-to-noise ratio to reduce the number of phase encoding steps, when the various imaging conditions include more than one imaging condition where the repetition time is equally long.

10. The magnetic resonance imaging apparatus according to claim 1, wherein,
the imaging sequence is a three-dimensional pulse sequence including phase encoding in two axis directions, and
wherein the computer is configured to perform control to reduce the number of phase encoding steps in the imaging where the repetition time is long, with respect to the phase encoding in at least one of the two axis directions.

11. The magnetic resonance imaging apparatus according to claim 9, wherein,
the computer is configured to reduce the number of phase encoding steps, by not measuring high-frequency data of k-space or by thinning out data of the k-space.

12. The magnetic resonance imaging apparatus according to claim 1, wherein,
the number of the images obtained when the number of phase encoding steps is small, is made half or less of the total number of the images used for generating the computed image.

13. The magnetic resonance imaging apparatus according to claim 1, wherein,
the number of phase encoding steps in the imaging where the repetition time long, is half or more of the number of phase encoding steps in the imaging where the repetition time is short.

14. The magnetic resonance imaging apparatus according to claim 1, further comprising,
a display unit configured to display a screen prompting a user to select at least either of a type of the computed image and an image quality thereof.

15. The magnetic resonance imaging method according to claim 2,
wherein the various imaging conditions include more than one imaging condition where the repetition time of the imaging sequence is equally long, and
wherein the number of phase encoding steps of the image is controlled in accordance with a length of the repetition time and a signal-to-noise ratio of the image.

16. The magnetic resonance imaging apparatus according to claim 1,
wherein the various imaging conditions include a first imaging condition and a second imaging condition, the first imaging condition having a first repetition time of the imaging sequence which is longer than a second repetition time of the imaging sequence of the second imaging condition,
wherein the computer is configured to control the measuring unit so that a first number of phase encoding steps in imaging in the first imaging condition where the repetition time is long is smaller than a second number of phase encoding steps in imaging in the second imaging condition where the second repetition time is shorter than the first repetition time,
wherein the first number of phase encoding steps in the first imaging condition, is half the number of phase encoding steps in the second imaging condition,
wherein a number of echoes in a kp direction in the first imaging condition is less than a number of echoes in a kp direction in the second imaging condition, and
wherein the computer is configured to perform control to conduct less measurement of high-frequency data than measurement of low-frequency data, among k-space data determined by phase encoding, thereby reducing the number of phase encoding steps in the imaging where the repetition time is long.

17. The magnetic resonance imaging method according to claim 2, further comprising:
reconstructing, by the computer, the original images so that a matrix size of an image obtained when the number of phase encoding steps is small, is made equal to the matrix size of the image obtained when the number of phase encoding steps is large.

18. The magnetic resonance imaging method according to claim 2,
wherein the various imaging conditions include a first imaging condition and a second imaging condition, the first imaging condition having a first repetition time of the imaging sequence which is longer than a second repetition time of the imaging sequence of the second imaging condition,
wherein the method further includes a step of controlling the measuring unit so that a first number of phase encoding steps in imaging in the first imaging condition where the repetition time is long is smaller than a second number of phase encoding steps in imaging in the second imaging condition where the second repetition time is shorter than the first repetition time,
wherein the first number of phase encoding steps in the first imaging condition, is half the number of phase encoding steps in the second imaging condition,
wherein a number of echoes in a kp direction in the first imaging condition is less than a number of echoes in a kp direction in the second imaging condition, and
wherein the method further comprises the step of performing control to conduct less measurement of high-frequency data than measurement of low-frequency data, among k-space data determined by phase encoding, thereby reducing the number of phase encoding steps in the imaging where the repetition time is long.

* * * * *